United States Patent [19]
Batruni et al.

[11] Patent Number: 4,989,170
[45] Date of Patent: Jan. 29, 1991

[54] HYBRID STOCHASTIC GRADIENT FOR CONVERGENCE OF ADAPTIVE FILTER

[75] Inventors: Roy G. Batruni, Newark; Howard A. Wilson, Santa Clara, both of Calif.

[73] Assignee: National Semiconductor Corporation, Santa Clara, Calif.

[21] Appl. No.: 478,719

[22] Filed: Feb. 8, 1990

Related U.S. Application Data

[63] Continuation of Ser. No. 204,615, Jun. 9, 1988, abandoned.

[51] Int. Cl.$^5$ .............................................. G06F 15/31
[52] U.S. Cl. .............................. 364/724.19; 364/553; 375/13
[58] Field of Search ............... 364/553, 724.01, 724.19, 364/724.2; 379/410, 411; 333/28 R; 375/13

[56] References Cited

U.S. PATENT DOCUMENTS

| | | | |
|---|---|---|---|
| 4,422,175 | 12/1983 | Bingham et al. | 364/724.2 |
| 4,594,725 | 6/1986 | Desperben et al. | 364/724.2 |
| 4,621,172 | 11/1986 | Kanemasa et al. | 379/411 |
| 4,811,261 | 3/1989 | Kobayashi et al. | 364/553 |

FOREIGN PATENT DOCUMENTS

61-257011  11/1986  Japan ............................ 364/724.19

OTHER PUBLICATIONS

Sondhi et al., "New Results on the Performance of a Well-Known Class of Adaptive Filters", Proceedings of the IEEE, vol. 64, #11, pp. 1583-1597, Nov. 1976.
Claasen, T. et al., "Comparison of the Convergence of Two Algorithms for Adaptive FIR Digital Filters", IEEE, CAS-28:6 (1981).
Widrow, B. et al., "Stationary and Nonstationary Learning Characteristics of the LMS Adaptive Filter", IEEE, 64:8 (1976), pp. 1151-1162.
Sethares, W. A. et al., "Parameter Drift in LMS Adaptive Filters", IEEE, ASSP-34:4 (1986), pp. 868-879.
Gersho, A., "Adaptive Filtering with Binary Reinforcement", IEEE, IT-30:2 (1984), pp. 191-199.

*Primary Examiner*—Dale M. Shaw
*Attorney, Agent, or Firm*—Limbach, Limbach & Sutton

[57] ABSTRACT

The present invention provides a technique for updating the coefficients $a(n)$ of an adaptive filter impulse response $A(n)$, where $$A'(n) = (a_0(n)\ a_1(n) \ldots a_m(n))$$

is the adaptive filter impulse response at time n. The impulse response is utilized for tracking the output $y(n)$ of a communications channel, where $$y(n) = \sum_{j=0}^{m} h_j s(n-j) = S'(n)H$$

where H is an unknown impulse response of the channel, $$H' = (h_0 h_1 \ldots h_m),$$

the ' character denoting transposition. The channel is driven with a known input signal $s(n)$, where $$S'(n) = (s(n)\ s(n-1) \ldots s(n-m)).$$

According to the techinque, the output $x(n)$ of an adaptive filter, where $$x(n) = S'(n)A(n)$$

is compared with the channel output $y(n)$ according to the Least Mean Squares (LMS) algorithm to develop an LMS error prediction signal. At the same time, the adaptive filter output $x(n)$ is compared with the channel output $y(n)$ according to the Sign Algorithm (SA) to develop an SA error prediction signal. If the LMS error signal is greater than or equal to a preselected value, then it is used to update the coefficients $a(n)$ of the adaptive filter impulse response. If the LMS error signal is less than the preselected value, then the SA error signal is used to update the coefficients $a(n)$.

5 Claims, 3 Drawing Sheets

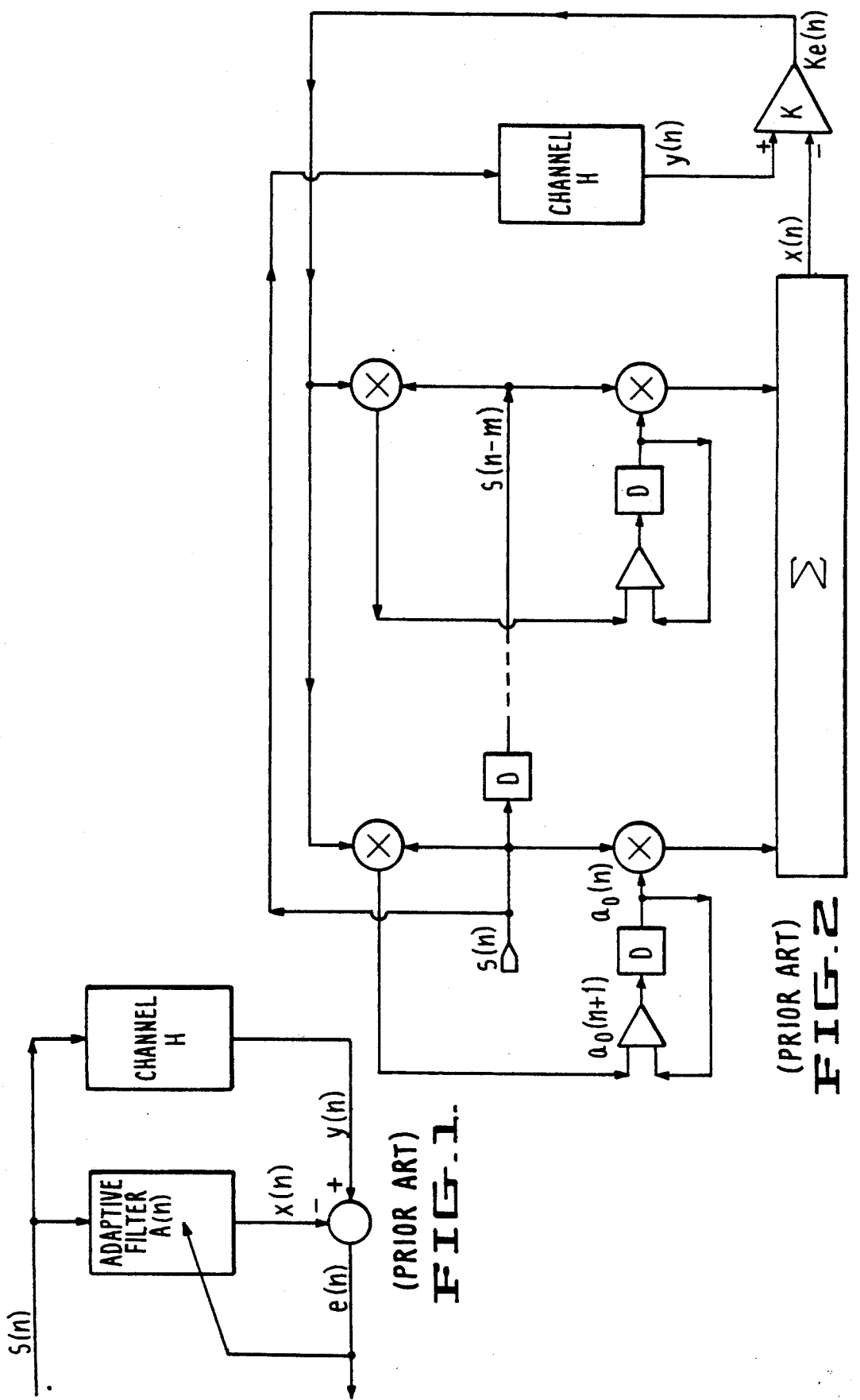

HYBRID STOCHASTIC GRADIENT FOR CONVERGENCE OF ADAPTIVE FILTER

This is a continuation of co-pending application Ser. No. 204,615 filed on 6/9/88, now abandoned.

BACKGROUND OF THE INVENTION

1. Field of the Invention

The present invention relates to telecommunications systems and, in particular, to an adaptive filtering coefficient update technique that combines features of the least mean squares algorithm and the sign algorithm to arrive at a hybrid stochastic gradient algorithm that is both fast and consistently convergent.

2. Discussion of the Prior Art

Two common adaptive filtering coefficient update algorithms are the Least Mean Squares (LMS) and the Sign Algorithm (SA). The LMS method is not consistently successful in converging a filter. However, in those situations where it does operate successfully, it is fast. The SA method, on the other hand, always succeeds, but it is slow.

A typical adaptive filtering application, shown in FIG. 1, involves driving a channel with an unknown impulse response H, $$H' = (h_0, h_1, ..., h_m) \quad (1)$$

where the ' character denotes transposition, with a known input signal $S(n)$, $$S'(n) = (s(n), s(n-1), ..., s(n-m)) \quad (2)$$

The output of the channel at time n is given by the convolution sum, $$y(n) = \sum_{j=0}^{m} h_j s(n-j) = S'(n) H. \quad (3)$$

In adaptively tracking the channel output, the adaptive filter produces an output $x(n)$, $$x(n) = S'(n) A(n) \quad (4)$$

where $$A'(n) = (a_0(n), a_1(n), ..., a_m(n)) \quad (5)$$

is the adaptive filter impulse response at time n.

Being time variable, the adaptive filter coefficients are updated as follows, $$A(n+1) = A(n) + g(n) f_1(e(n)) f_2(S(n)) \quad (6)$$

$$e(n) = y(n) - x(n) \quad (7)$$

where $e(n)$ is the prediction error, $g(n)$ is a gain that can be either constant or time variable, and $f_1(.)$ and $f_2(.)$ are generalized functions.

Adhering to adaptive filtering terminology, it is said that "convergence" is achieved when $$A(n) = H \text{ for all } n, \quad (8)$$

$$e(n) = Q \text{ for all } n, \quad (9)$$

In practice, Equations (8) and (9) above will not be exact equalities. Rather, there will be a misadjustment between $A(n)$ and H, and $0 < |e(n)| < \rho$, where $\rho$ is small, i.e. the practical limit of the algorithm.

Both the Least Mean Squares algorithm and the Sign Algorithm have received extensive treatment in the theoretical literature and have found wide practical application.

Referring to FIG. 2, which shows a possible circuit implementation of the LMS algorithm, the LMS algorithm structure may be expressed as follows:

$$A(n+1) = A(n) + K\, e(n)\, S(n) \quad (10)$$

where K is a constant positive coefficient adaption step size. The choice of K for an assured convergence is discussed by B. Widrow et al., "Stationary and Non-Stationary Learning Characteristics of the LMS Adaptive Filter", Proceedings of the IEEE, vol. 64, pp. 1151-1162, Aug. 1976.

If K is chosen according to the criteria set forth by Widrow et al, then convergence is assured. However, in practical telecommunications applications, the channel H over which echo cancellation or equalization is being performed is not known. Consequently, it is impossible to determine K a priori, and convergence is not guaranteed over any arbitrary channel. When convergence does take place, the result is the minimization of the expected value of the error squared $u = E(e(n)^2)$; that is, the error variance is minimized. The product $e(n)S(n)$ used in Eq. (10) above is a biased estimate of the slope of the expected value of the error squared $w = dv/dA(n)$.

In a digital implementation of the LMS algorithm, when convergence starts, $e(n)$ is large and K is typically fixed at $K = 1/(2^{11})$; the coefficients $A(n)$ are 24 bits wide (1 sign bit + 23 magnitude bits). The product $p = Ke(n)$ is equivalent to shifting $e(n)$ to the right by 11 places and, initially, when $e(n)$ is large, p is still on average such that $|p| > 1/(2^{23})$ and, therefore, this update is "seen" by $A(n)$. However, as convergence progresses and $e(n)$ becomes smaller as desired, $|p| < 1/(2^{23})$ and the coefficients $A(n)$ are not being updated anymore. Therefore, convergence is not optimal, since by using more than 24 bits for $A(n)$, convergence could have proceeded and $e(n)$ could have been further decreased.

The LMS algorithm has also shown parameter drift properties that are described by Sethares et al, "Parameter Drift in LMS Adaptive Filters", IEEE Transactions on Acoustics, Speech and Signal Processing, vol.ASSP-34 No. 4, Aug. 1986, and have been observed in a working prototype. The problem is that, with bounded steady state inputs, the output $x(n)$ and the error $e(n)$ remain bounded and approximately zero, respectively, while the parameters $A(n)$ drift away from H very slowly.

Referring to FIG. 3, which shows a possible circuit implementation of the Sign Algorithm, the Sign Algorithm structure may be expressed as follows:

$$A(n+1) = A(n) + L\, \text{sign}(e(n))\, S(n) \quad (11)$$

where L is a constant positive step size, usually equal to the least significant bit in the coefficients $A(n)$. Convergence is achieved for any positive L, as discussed by A. Gersho, "Adaptive Filtering With Binary Reinforcement", IEEE Transactions on Information Theory, Vol. IT-30, No. 2, Mar. 1984.

For the same desired residual error variance as the LMS technique described above, the convergence time for the Sign Algorithm is always longer than the LMS algorithm, as described by Gersho and by T.A.C.M. Claasen and W.F.G. Mecklenbrauker, "Comparison of the Convergence of Two Algorithms for Adaptive FIR Digital Filters", IEEE Transactions on Circuits and Systems, Vol. CAS-28, No. 6, June 1981. Implementation of the Sign Algorithm is simpler than the LMS algorithm, since p=Ke(n) in LMS becomes +L or −L in the Sign Algorithm. When convergence is achieved, the Sign Algorithm minimizes the expectation of the absolute value of the error, $E(|e(n)|)$. In the course of convergence and after it is achieved, in a digital implementation, the coefficient vectors A(n) always "see" the updating increment, since to every coefficient of A(n), a least significant bit is added or subtracted depending on sign(e(n)) and the corresponding s(n−j).

No parameter drift has been observed in the Sign Algorithm. A theoretical reason is not known, but it is believed that the hard limiting of the error signal gives an unbiased estimate of w=dv/dA(n), which is essential for the stability of the steady state convergence.

Summary of the Invention

The present invention provides a technique for updating the coefficients a(n) of an adaptive filter impulse response A(n), where $$A'(n)=(a_0(n), a_1(n),...,a_m(n))$$

is the adaptive filter impulse response at time n. The impulse response is utilized for tracking the output y(n) of a communications channel, where $$y(n) = \sum_{j=0}^{m} h_j s(n - j) = S'(n)H$$

where H is an unknown impulse response of the channel, $H'=(h_0, h_1,...,h_m)$, the ' character denoting transposition. The channel is driven with a known input signal S(n), where $S'(n)=(s(n), s(n-1),...,s(n-m))$.

According to the technique, the output x(n) of an adaptive filter, where $x(n)=S'(n) A(n)$ is compared with the channel output y(n) according to the Least Mean Squares algorithm to develop an LMS error prediction signal. At the same time, the adaptive filter output x(n) is compared with the channel output y(n) according to the Sign Algorithm to develop a Sign Algorithm error prediction signal. If the Least Mean Squares error signal is greater than or equal to a preselected value, then it is used to update the coefficients a(n) of the adaptive filter impulse response. If the Least Mean Squares error signal is less than the preselected value, then the Sign Algorithm error signal is used to update the coefficients a(n).

A better understanding of the features and advantages of the present invention will be obtained by reference to the following detailed description of the invention and accompanying drawings which set forth an illustrative embodiment in which the principles of the invention are utilized.

DESCRIPTION OF THE DRAWINGS

FIG. 1 is a simple schematic block diagram illustrating a typical application of an adaptive filter.

FIG. 2 is a schematic block diagram illustrating an embodiment of an adaptive filter using the Least Mean Squares algorithm.

DETAILED DESCRIPTION OF THE INVENTION

Both the Least Mean Squares (LMS) and the Sign Algorithm (SA) described above belong to the family of stochastic gradient algorithms. These algorithms update the adaptive filter coefficients such that the error moves in a negative gradient sense on the average. Therefore, in a stochastic fashion, the error gradient is evaluated by $-g(n)f1(e(n))f2(S(n))$ in Equation (6) above and the coefficients are changed in the opposite direction.

Combining the LMS and SA yields another stochastic gradient algorithm, identified herein as the Hybrid Stochastic Gradient (HSG), since the gradient will have one of two possible estimation methods at each time point.

Let ~ denote raising to a power, and M equal the number of magnitude bits in each coefficient in A(n). Then, at time n, (1) c=sign (e(n));
(2) d=K e(n);
(3) if $|d| \geq 2\sim(-M)$, then d is unchanged;
(4) if $|d| < 2\sim(-M)$, then $d=c\ 2\sim(-M)$; and
(5) A(n+1)=A(n)+d S(n).

The properties of the HSG are:

Initially, when e(n) is large, the HSG behaves as a LMS algorithm with fast convergence. In those cases where a channel exists for which K does not result in convergence for the LMS, the HSG behaves as a SA and has guaranteed, albeit slow, convergence.

As convergence proceeds and e(n) becomes small, step (4) above becomes dominant. That is, the HSG switches automatically to an SA format and the updates are still seen by the coefficients. In the steady state, the HSG behaves according to the SA and, therefore, it minimizes $E(|e(n)|)$.

Thus, the HSG exhibits both the speed of the LMS as well as the guaranteed convergence of the SA. Since, in steady state, it behaves according to the SA, the unbiased estimates of w=dv/dA(n) enable it to avoid the parameter drift problem found in the LMS.

Figure 3:
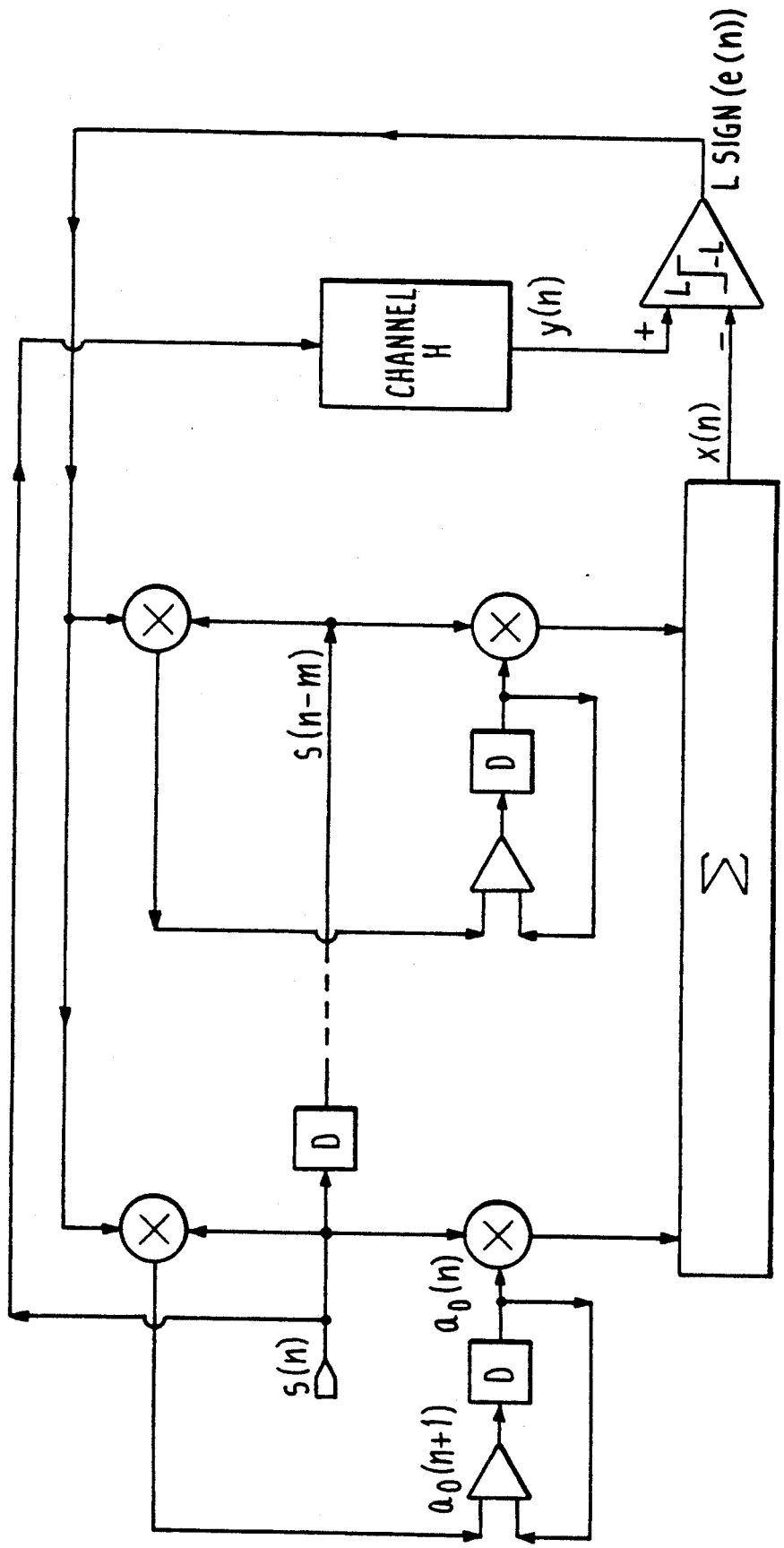
FIG. 3 is a schematic block diagram illustrating an embodiment of an adaptive filter using the Sign Algorithm.
Figure 4:
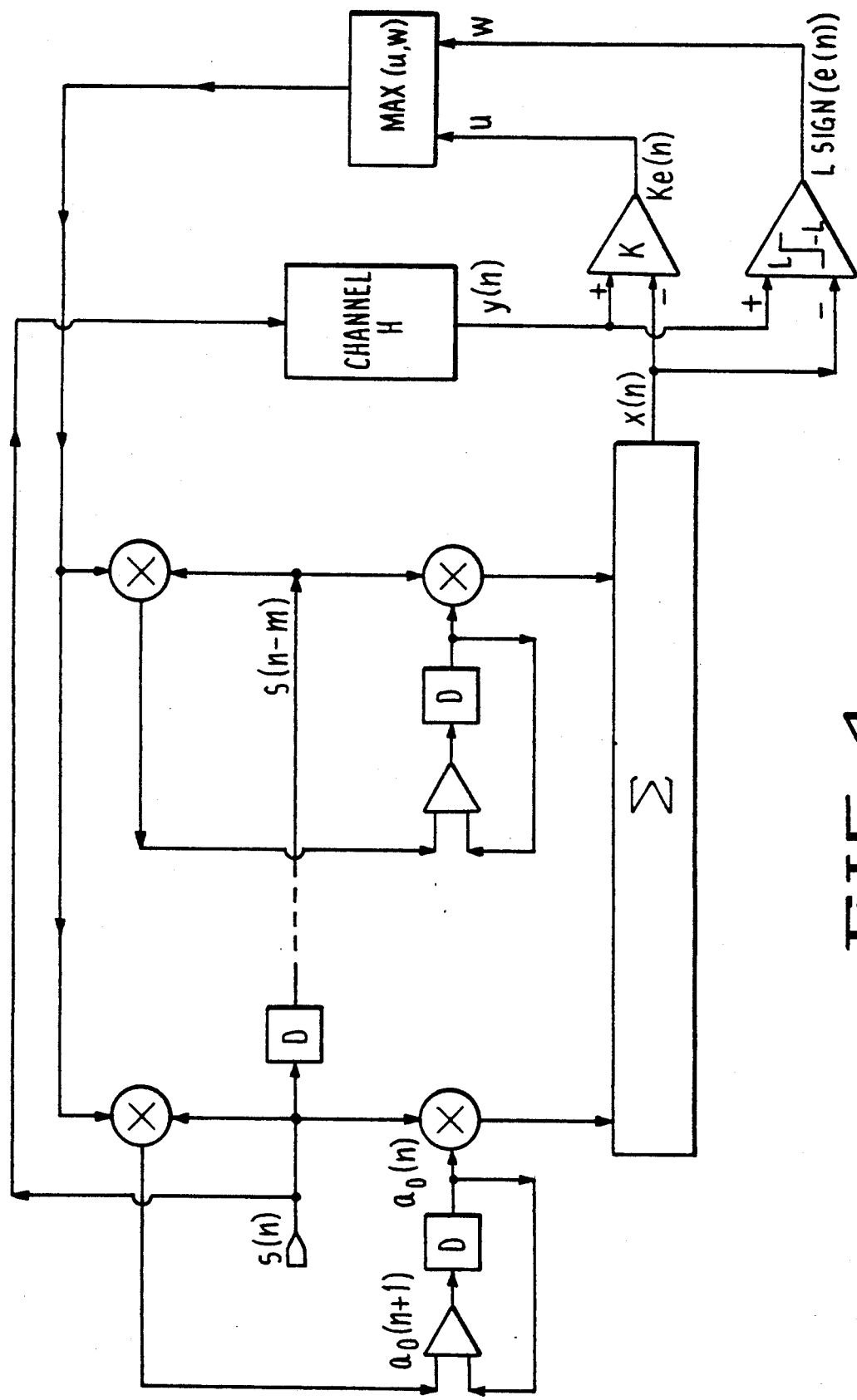
FIG. 4 is a schematic block diagram illustrating an embodiment of an adaptive filter using the hybrid stochastic gradient algorithm in accordance with the present invention.

FIG. 4 shows an circuit implementation of the Hybrid Stochastic Gradient (HSG).

The impulse response A(n) of an adaptive filter at time n where $A'(n)=(a_0(n), a_1(n),...,a_m(n))$, is utilized for tracking the output y(n) of a communications channel, where $$y(n) = \sum_{j=0}^{m} h_j s(n - j) = S'(n)H$$

H being the unknown impulse response of the channel, where $H'=(h_0,h_1,...,h_m)$.

The ' character denotes transposition. The channel is driven with a known input signal S(n), where $S'(n)=(s(n), s(n-1),...,s(n-m))$.

The adaptive filter generates an output x(n), where x(n)=S'(n) A(n).

The channel output y(n) is compared with the adaptive filter output x(n) according to the LMS to develop a first error prediction signal Ke(n). Simultaneously, the channel output y(n) is compared with the adaptive filter output x(n) according to the SA to develop a second error prediction signal L Sign (e(n)). If the LMS error signal is greater than or equal to a preselected value, then it is used to update the coefficients a(n) of the adaptive filter impulse response. If the LMS error signal is less than the preselected value, then the SA error signal is used to update the coefficients a(n).

Advantages of the LMS and SA complement each other. By combining those algorithms into one, the HSG of the present invention, these advantages are obtained in one algorithm. Thus, the HSG provides speed of convergence, assured convergence, steady state stability and optimal residual error in the absolute value sense.

It should be understood that the scope of the present invention is not intended to be limited by the specifics of the above-described embodiment, but rather is defined by the accompanying claims.

What is claimed is:

1. Stochastic control circuitry for adaptively tracking the output of a communication channel, the stochastic control circuitry comprising:
   (a) an adaptive filter;
   (b) means for driving both the adaptive filter and the communications channel utilizing a common input signal to produce an adaptive filter output signal and a communications channel output signal, respectively;
   (c) first comparator means for comparing the adaptive filter output signal and the communications channel output signal in accordance with a first criteria to generate a first comparator output signal;
   (d) second comparator means for comparing the adaptive filter output signal and the communications channel output signal in accordance with a second criteria to produce a second comparator output signal; and
   (e) third comparator means, which receives the first and second comparater output signals as inputs, for comparing the first comparator output signal and a preselected value and wherein the third comparator means provides the first comparator output signal as a third comparator output signal if the first comparator output signal is greater than or equal to the preselected value and provides the second comparator output signal as the third comparator output signal if the first comparator output signal is less than the preselected value.

2. Stochastic control circuitry as in claim 1 wherein the adaptive filter comprises convergence means for converging the input signal in accordance with adaptive filter impulse response coefficients and
means for updating the adaptive filter impulse response coefficients utilizing the third comparator output signal.

3. Stochastic control circuitry responsive to an input signal S(n), where s'((n)=[S(n), S(n−1),... S(n−m)], where n and m are time variables and denotes transposition, the stochastic control circuitry comprising:
   (a) a communications channel including means for implementing a communications channel impulse response function H, where H'=(h$_0$, h$_1$, h$_2$,...,h$_m$), to generate a communications channel output signal y(n), where $$y(n) = \sum_{j=0}^{m} h_j * s(n - j) = S'(n) * H;$$

(b) an adaptive filter including means for implementing an adaptive filter impulse response function A(n), where A'(n)=(a$_0$(n), a$_1$(n),... a$_m$(n)), where a$_0$(n) through a$_m$(n) are adaptive filter coefficients, and having a next state A(n+1) where A(n+1)=A(n)+g(n)*f$_1$(e(n))*f$_2$(S(n)) and e(n)=y(n)−x(n), where e(n) is a prediction error, g(n) measures a gain, and f$_1$ and f$_2$ are generalized functions, to generate an adaptive filter output signal x(n), where x(n)=S'(n)*A(n), the adaptive filter connected in parallel to the communications channel;
   (c) first comparator means for comparing the communications channel output signal y(n) and the adaptive filter output signal x(n) in accordance with a first convergence algorithm to generate a first error prediction signal;
   (d) second comparator means for comparing the communications channel output signal y(n) and the adaptive filter output signal x(n) in accordance with a second convergence algorithm to generate a second error prediction signal; and
   (e) third comparator means, responsive to the first and second error prediction signals, for comparing the first error prediction signal and a preselected value and for providing the first error prediction signal as a selected error prediction signal if the first error prediction signal is greater than or equal to the preselected value and for providing the second error prediction signal as the selected error prediction signal if the first error prediction signal is less than the preselected value.

4. Stochastic control circuitry as in claim 3 wherein the adaptive filter further comprises means responsive to the selected error prediction signal for updating the adaptive filter coefficients.

5. Stochastic control circuitry as in claim 4 wherein the first convergence algorithm is the Least mean Squares Algorithm and the second convergence algorithm is the Sign Algorithm.

* * * * *

UNITED STATES PATENT AND TRADEMARK OFFICE
CERTIFICATE OF CORRECTION

PATENT NO. : 4,989,170

DATED : Jan. 29, 1991

INVENTOR(S): Roy G. Batruni et al.

It is certified that error appears in the above - identified patent and that said Letters Patent is hereby corrected as shown below:

Col. 1, formula (9) should read --e(n)=0 for all n,--.

Col. 3, lines 34-36, the words "the 'character..., where" should be in regular text type.

Col. 6, line 9, after "variables and" insert --'--.

Col. 6, line 57, "mean" should be --Mean--.

Signed and Sealed this

Fourth Day of August, 1992

Attest:

DOUGLAS B. COMER

Attesting Officer

Acting Commissioner of Patents and Trademarks